(12) United States Patent
Hayakawa

(10) Patent No.: US 7,303,854 B2
(45) Date of Patent: Dec. 4, 2007

(54) ELECTRODE-FORMING COMPOSITION FOR FIELD EMISSION TYPE OF DISPLAY DEVICE, AND METHOD USING SUCH A COMPOSITION

(75) Inventor: Keiichiro Hayakawa, Tochigi (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/702,979

(22) Filed: Nov. 6, 2003

(65) Prior Publication Data
US 2004/0191690 A1    Sep. 30, 2004

Related U.S. Application Data

(60) Provisional application No. 60/447,385, filed on Feb. 14, 2003.

(51) Int. Cl.
*G03F 7/00* (2006.01)
(52) U.S. Cl. .................... 430/270.1; 430/273.1; 430/901; 430/902
(58) Field of Classification Search ............ 430/270.1, 430/273.1, 901, 902
See application file for complete search history.

(56) References Cited

U.S. PATENT DOCUMENTS

| | | | |
|---|---|---|---|
| 2,760,863 A | 8/1956 | Plameck, Jr. | |
| 2,850,445 A | 9/1958 | Oster | |
| 2,875,047 A | 2/1959 | Oster | |
| 2,927,022 A | 3/1960 | Martin et al. | |
| 3,074,974 A | 1/1963 | Gebura | |
| 3,097,096 A | 7/1963 | Oster | |
| 3,097,097 A | 7/1963 | Oster | |
| 3,145,104 A | 8/1964 | Oster et al. | |
| 3,380,381 A | 4/1968 | Musgrave | |
| 3,427,161 A | 2/1969 | Laridon et al. | |
| 3,479,186 A | 11/1969 | Taylor et al. | |
| 3,549,367 A | 12/1970 | Chang et al. | |

(Continued)

FOREIGN PATENT DOCUMENTS

EP    0 414 167 A    2/1991

(Continued)

OTHER PUBLICATIONS

Patent Abstracts of Japan, vol. 1999, No. 02, Feb. 26, 1999 & JP 10 294018 A (ULVAC Japan Ltd), Nov. 4, 1998.

(Continued)

*Primary Examiner*—Amanda Walke
(74) *Attorney, Agent, or Firm*—Loretta Smith

(57) ABSTRACT

A composition utilized in and a method for forming an electrode used in field emission type of display devices said composition is a photosensitive copper conductive composition comprising: a mixture of (a) copper powder at least 70 wt % out of 100 wt % copper powders having a particle size in the range of 0.2-3 μm and (b) an inorganic binder with a softening point in the range of 380-580° C. in an amount of 140 wt % based on 100 wt % copper powders, said mixture being dispersed in an organic vehicle comprising (c) an organic polymer binder, (d) a phototoinitiator, (e) a photo-hardenable monomer, and an organic solvent; and the photosensitive copper conductive composition being fireable at a temperature in the range of 450-600° C. in a reductive atmosphere.

2 Claims, 11 Drawing Sheets

U.S. PATENT DOCUMENTS

| | | | |
|---|---|---|---|
| 3,684,771 A | 8/1972 | Braun | |
| 3,788,996 A | 1/1974 | Thompson | |
| 4,032,698 A | 6/1977 | Ashe | |
| 4,070,388 A | 1/1978 | Jones | |
| 4,162,162 A | 7/1979 | Dueber | |
| 4,598,037 A * | 7/1986 | Felten | 430/281.1 |
| 5,032,490 A * | 7/1991 | Nebe et al. | 430/281.1 |
| 5,047,313 A * | 9/1991 | Nebe et al. | 430/281.1 |
| 5,738,977 A * | 4/1998 | Van Der Sluis-Van Der Voort et al. | 430/313 |
| 5,874,197 A * | 2/1999 | Felten | 430/281.1 |
| 6,074,893 A * | 6/2000 | Nakata et al. | 438/106 |
| 6,204,600 B1 | 3/2001 | Park et al. | |
| 6,214,527 B1 * | 4/2001 | Kosaka et al. | 430/319 |
| 6,762,009 B2 * | 7/2004 | Glicksman et al. | 430/287.1 |

FOREIGN PATENT DOCUMENTS

| | | |
|---|---|---|
| GB | 1 339 930 | 12/1973 |
| JP | 2-256106 | 10/1990 |
| JP | 1994290634 A | 10/1994 |
| JP | 9-035670 | 2/1997 |
| JP | 1997045131 A | 2/1997 |
| JP | 10-21458 | 1/1998 |
| JP | 10-144208 | 5/1998 |
| JP | 10-144210 | 5/1998 |
| JP | 10-294018 | 11/1998 |
| JP | 2001167907 A | 6/2001 |
| WO | WO 01/99146 A2 | 12/2001 |

OTHER PUBLICATIONS

Henry L. Jakubauskas, Use of A-B Block Polymers as Dispersants For Non-aqueous Coating Systems, Journal of Coating Technology, May 1986, vol. 58, No. 736, pp. 71-82.

* cited by examiner

ELECTRODE-FORMING COMPOSITION FOR FIELD EMISSION TYPE OF DISPLAY DEVICE, AND METHOD USING SUCH A COMPOSITION

CROSS-REFERENCE TO RELATED DOCUMENTS

The present application claims the benefit of Provisional Application 60/447,385 filed on Feb. 14, 2003.

FIELD OF THE INVENTION

The present invention pertains to a type of electrode used for a field emission type of display device. In particular, the present invention pertains to a photosensitive copper conductive composition used for forming a gate electrode and a method that uses the aforementioned composition to form an electrode used for a field emission type of display device.

BACKGROUND OF THE INVENTION

In the following, the configuration of a general field emission type display device will be explained with reference to FIG. 1.

The field emission electrode (cathode) is usually formed on the back glass substrate, with there being a space set between the front and back glass substrates. The space is in an ultrahigh vacuum state so that electrons can easily pass from the cathode (emitter) electrode, with a light-emitting layer coated with a phosphor, to an anode electrode formed on the opposite (front substrate) side. The two glass substrates are sealed with a glass frit. Band (belt)-shaped (in another words, it is long narrow strip) gate electrodes (used for extracting electrons from the emitter, releasing electrons to the anode electrode, and controlling the quantity of the electrons released from the emitter by controlling the voltage applied to the gate electrodes) are formed on a dielectric layer in such a way that the gate lines are in parallel with each other and perpendicular to the cathode electrodes. Gate openings with a prescribed diameter that constitute electron releasing parts are formed at the crossing parts of the gate lines and the cathode lines. Emitters made of, e.g., carbon nanotubes are formed at the gate openings. By applying a high voltage between the transparent anode electrode and the cathode electrode on the display glass substrate, electrons pass into the vacuum from the emitter electrode and collide with the phosphor surface. Energy levels are changed by the level of electrons passing to the phosphor surface, this results in a display of the light emission phenomenon.

Conventionally, a gate electrode is formed using lithographic technology to etch a thin film formed by deposition/sputtering/chemical vapor deposition (CVD) Mo, Cr, etc. (see Japanese Kokai Patent Application No. Hei 9[1997]-35670) or formed using the photolithographic method or wet etching method (see Japanese Kokai Patent Application No. Hei 10[1998]-21458). The electrodes of a field emission type display device, plasma display, or other flat display devices can also be formed as follows. After a photosensitive silver printing paste is used to form a film on a glass substrate, UV exposure and development are performed to pattern the film into the electrode shape, followed by sintering (see Japanese Kokai Patent Application Nos. 10[1998]-144208 and Hei 10[1998]-144210).

However, gate electrode formation using the aforementioned thin film technology is only used for the fundamental research and development of the field emission type display device, and the best film thickness that can be realized in practical applications is merely 1 μm. Although there are various opinions, the resistivity of the gate electrode is usually desired to be 100 μohm·cm or lower. In the case of commercializing a large-scale field emission type display device, use of the thin film technology might significantly increase the equipment investment and the manufacturing cost. If the cathode electrode, insulating layer, gate electrode, and other parts formed on the back substrate can be formed with thick film technology, the manufacturing cost can be cut significantly, and, if necessary, parts with a thickness of several μm can be formed. Based on this point of view, the potential application of the thick film technology as much as possible in the same way to a PDP (plasma display panel) is firmly rooted.

In the following, several restrictions concerned with the gate electrode of a field emission type display device based on thick film technology will be explained. First of all, the sintering temperature is low. For PDP, a temperature in the range of 500-600° C. can be used for sintering the thick film parts. The field emission type display device, however, has a higher pattern precision requirement than PDP. Therefore, the thick film parts should be sintered at a temperature below 550° C., preferably around 500° C. Second of all, the thickness of the insulating layer in contact with the gate electrode is preferably 10 μm or less, and there is a short circuit or voltage breakdown occurring between the upper gate electrode and the lower cathode electrode. The conventional various types of thick film insulators have a thickness in the range of 20-50 μm, and a thick-film silver electrode can be used. Even with PDP, photosensitive silver electrode material is very popular, and photosensitive thick-film silver electrode material is used as the bus electrode below the transparent dielectric on the front panel. However, it is questionable whether silver can be used for the upper gate electrode with the thickness of the insulating layer being only half (10 μm) of that in the conventional technology, even if the lower cathode electrode is a thin film. The reason is that silver will be diffused into the thin insulating film that constitutes the base of the gate electrode. As a result, the breakdown voltage characteristic and the insulation property of the insulating layer will be deteriorated.

In addition to silver, other conductive components include ITO, nickel, copper, gold, aluminum, tungsten, carbon, etc. First of all, gold, tungsten, and nickel are inappropriate due to the fact that sintering should be carried out at around 500° C. Aluminum is inappropriate because of its powder cost and handleability. ITO is inappropriate due to its electroconductivity. Carbon is inappropriate in consideration of the stability in vacuum. Thus, copper is the only choice left that can be used for the gate electrode.

If copper is sintered in an oxidizing atmosphere, an oxide film will be formed on the surface, inhibiting the sintering and preventing the action of copper as a conductor. Therefore, copper must be sintered in a reductive atmosphere. As described in International Laid-open Patent WO 01/99146 proposed by the present applicant, in the manufacturing method of a field emission type display device, a thick film composition containing carbon nanotubes is used for the emitter electrode of the cathode in a step after forming the gate electrode, and it is necessary to sinter the aforementioned composition in a reductive atmosphere. Consequently, investment in equipment for a reductive-atmosphere sintering furnace that is particularly used for forming the gate electrode becomes unnecessary. This is not considered to be a significant restriction.

Also, in consideration of the sintering of copper, as described in Japanese Kokai Patent Application No. Hei 10[1998]-294018, sintering can be performed at 500° C. or lower by carrying out calcination under vacuum, followed by secondary calcination in an oxidizing atmosphere and the main sintering in a reductive atmosphere. Currently, however, it is still technically unrealistic and very difficult to sinter a large glass substrate.

Additionally, use of the compositions of this invention is also conducive to fabricating a lighting device. Such a device comprises (a) a cathode including an electrode as outlined in this work and (b) an optically transparent electrically conductive film serving as an anode and spaced apart from the cathode, and (c) a phosphor layer capable of emitting light.

The patterned and/or layered electrodes provided by this invention can be used in the cathodes of electronic devices such as triodes and in particular in field emission display devices. Such a display device comprises (a) a cathode using an electron field emitter, (b) an optically transparent electrically conductive film serving as an anode and spaced apart from the cathode, (c) a phosphor layer capable of emitting light upon bombardment by electrons emitted by the electron field emitter and positioned on or adjacent to the anode, and between the anode and the cathode, and (d) one or more gate electrodes disposed between the phosphor layer and the cathode. The use of the compositions of this invention to fabricate the cathode, including the insulator, and gate structures is readily adapted to cathodes of large size display panels.

PROBLEMS TO BE SOLVED BY THE INVENTION

Consequently, a purpose of the present invention is to provide a type of photosensitive copper conductive composition with the following features: when thick film technology is used to form electrodes, particularly gate electrodes of a field emission type display device, the resolution is high, and sintering can be performed at a temperature in the range of 450-600° C., preferably around 500° C., to obtain the required electroconductivity; also, the breakdown voltage characteristic and insulation property of the dielectric layer underlying below the gate electrode will not be adversely affected, and the manufacturing cost can be reduced. Another purpose of the present invention is to provide a manufacturing method of a field emission type display device, in particular electrodes of such display device, using the aforementioned photosensitive copper conductive composition.

MEANS FOR SOLVING THE PROBLEMS

In order to realize the aforementioned purpose, the present invention provides a photosensitive copper conductive composition comprising: a mixture containing (a) copper powder with at least 70 wt % out of [a total of] 100 wt % copper powders having a particle size in the range of 0.2-3 μm and (b) an inorganic binder with a softening point in the range of 380-580° C. in an amount of 1-40 wt % based on 100 wt % copper powders said mixture being dispersed in an organic vehicle comprising (c) an organic polymer binder, (d) an photoinitiator, (e) a photohardenable monomer, and an organic solvent; the photosensitive copper conductive composition being fireable sintered at a temperature in the range of 450-600° C. in a reductive atmosphere.

The present invention also provides a method for forming an electrode of a field emission type display device, characterized by having the following steps: a step in which the aforementioned photosensitive copper conductive composition is coated as a gate electrode on an underlying layer of dielectric layer formed on a glass substrate, a step in which the coated layer is exposed to actinic radiation through a prescribed electrode pattern mask to photopolymerize the exposed part, a step in which the development is performed to remove the unexposed part, and a step in which sintering is performed based on a sintering profile with the sintering peak temperature around about 500° C. in a reductive atmosphere to burn out the organic solvent and to sinter the inorganic binder powder and the copper powder.

In addition, the present invention provides another method for forming an electrode of a field emission type display device, characterized by having the following steps: a step in which the aforementioned photosensitive copper conductive composition is coated as a gate electrode on an underlying layer of dielectric layer formed on a glass substrate, a step in which the coated layer is exposed to actinic radiation through a prescribed electrode pattern mask to photopolymerize the exposed part, a step in which the development is performed to remove the unexposed part, and a step in which sintering is performed based on a sintering profile with the sintering peak temperature around about 500° C. in a virtually non-oxidizing atmosphere, in which the oxygen concentration in the temperature range of 300-400° C. for burning out the organic solvent in the aforementioned profile is in the range of 30-1000 ppm and the oxygen concentration at a temperature of 400° C. or higher for sintering the inorganic binder powder and the copper powder is in the range of 10-500 ppm.

BRIEF DESCRIPTION OF THE DRAWINGS

FIG. 2 details the gate-electrode formation process.

DETAILED EXPLANATION OF THE INVENTION

Embodiment of the Invention

Figure 1:
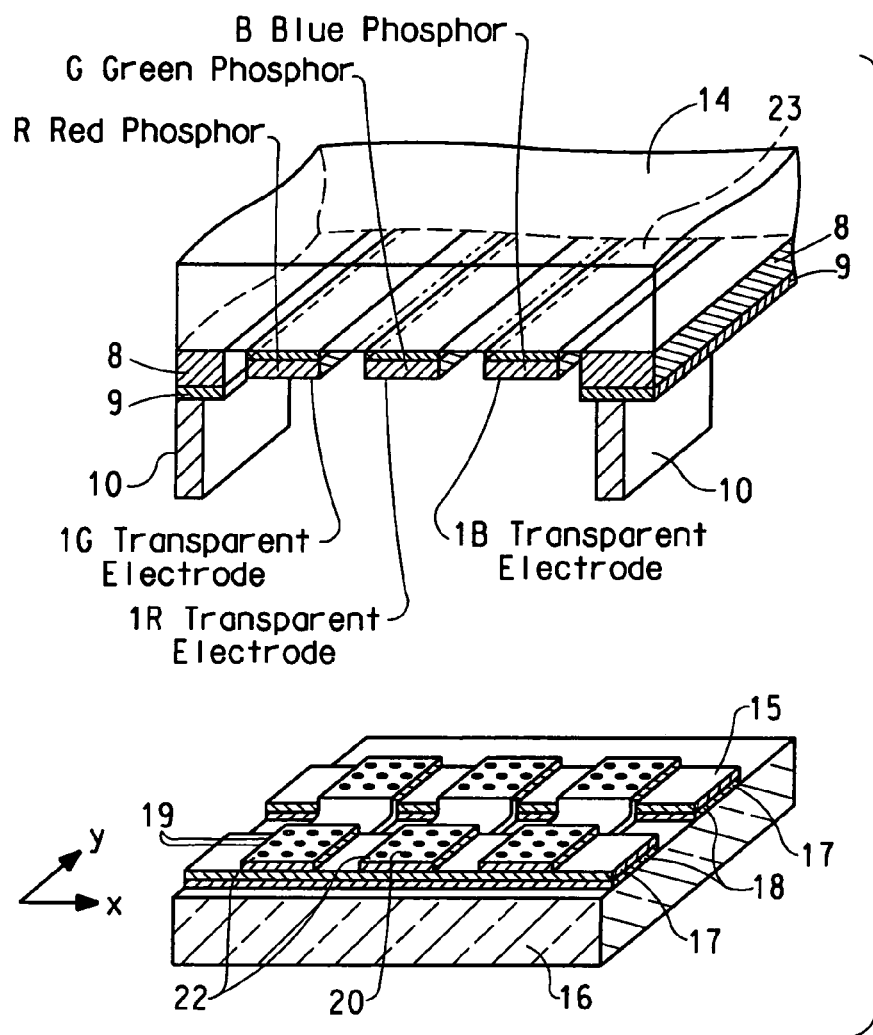
FIG. 1 details the configuration of a general field emission type display device.

In the following, the present invention will be explained in more detail with reference to figures based on the embodiment of the present invention.

In the present invention, the electrode-forming constituting composition used for a field emission type display device includes (a) copper powder, (b) inorganic binder powder, (c) organic polymer binder, (d) photoinitiator, (e) photohardenable monomer, and (f) organic solvent. In the following, each of these components will be described in detail.

(a) Copper Powder

Copper powder in virtually any shape including spherical particles and flakes (rod shaped, cone shaped, plate shaped) can be used in the present invention. The spherical particles are preferred from the point of view of realizing a high resolution, depending on the photosensitivity. The dispersion of the present invention does not contain a large amount of solid having a particle size of 0.2 μm or smaller. When particles in such a small size exist in the film or in a layer, when sintering performed in order to eliminate the organic solvent or to sinter the inorganic binder powder and the copper powder, it is difficult to completely burn out the organic solvent, and the storage stability of the photosensitive copper conductive composition will easily be deteriorated. Also, the maximum particle size of the copper powder should not exceed 10 μm. The maximum particle size is preferably to be 5 μm or smaller. If the particle size is too large, the gate electrode will have irregular protrusions, which will cause significant dispersion in the release of electrons from the cathode. The average particle size should be in the range of 0.2-3 μm, preferably in the range of 0.3-1.5 μm, or more preferably in the range of 0.6-1.2 μm. If the average particle size is too small, significant sintering shrinkage will occur, deteriorating the patterning precision. On the other hand, if the average particle size is too large, the smoothness of the gate electrode will be deteriorated.

(b) Inorganic Binder

The glass frit used in the present invention can be any well-known composition as long as it can accelerate sintering of the copper particles and has a melting point lower than that of copper. However, in order to make electrodes formed of the composition of the present invention have a sufficiently high electroconductivity, the glass softening point of the inorganic binder powder (Tc: second transition point of DTA) should be in the range of 380-580° C., preferably in the range of 400-500° C., and more preferably in the range of 420-470° C. If the softening point is too low, the organic solvent that is burnt out at a temperature in the range of 300-400° C. will drip on the softened glass. As a result, softening of the glass will be hindered. Also, inappropriate sintering caused by the remaining carbon and out-gas in vacuum will occur. On the other hand, if the softening point is too high, the glass frit will not accelerate sintering of the copper powder, and the role of the inorganic binder will not be displayed.

Examples of the glass powder compositions that can be used include borosilicate, lead silicate, zinc borosilicate, bismuth silicate, phosphate, soda glass, and other well-known glass compositions having a low softening point. An average particle size in the range of 0.5-1.5 μm is realistic in practical applications, while an average particle size in the range of 0.8-1.2 μm is preferred. Since the powder is manufactured by means of mechanical pulverization (wet type and dry type) in most cases, there is a lower limit on the particle size. If the particles are too small, when the photosensitive composition is used as a paste, it will be gelled, and there is a high possibility of a viscosity change. On the other hand, if the particle size is too large, large holes will be formed after sintering. As a result, the electroconductivity will be deteriorated, and a poor shape caused by bubbling might result. The amount of the inorganic binder powder added is preferably in the range of 1-40 wt %, or more preferably in the range of 5-20 wt %, based upon 100 wt % copper powders. If the content of the inorganic binder powder is too low, the adhesion strength to the base after the sintering becomes low, and the resistance becomes more sensitive with respect to the conditions of the sintering atmosphere. If the content of the inorganic binder powder is too high, although the adhesion strength to the base can be improved and the smoothness can be improved due to the improvement of the compactness of the film, excessive inorganic binder powder will cause bubbling.

(c) Organic Polymer Binder

The polymer binder is an important part of the composition of the present invention. In consideration of the aqueous treatment possibility, it is indispensable for realizing a high resolution. These essential conditions can be satisfied by selecting the following binder. That is, the binder is a copolymer or interpolymer containing: (1) a C1-C10 alkyl acrylate, C1-C10 alkyl methacrylate, styrene, substituted styrene, or combinations thereof and (2) an acidic comonomer containing an ethylenically e-type unsaturated carboxylic acids, containing moiety which is at least 15 wt % of the total weight of the polymer.

Presence of the acidic copolymer component in the composition is critical to the present technology. The acid functional groups make it possible to perform development in an aqueous base, such as a 0.8% sodium carbonate aqueous solution. If the concentration of the acidic comonomer is less than 15%, the composition does not wash out in an aqueous base. If the concentration of the acidic comonomer is more than 30%, it becomes unstable under humid conditions. Also, partial development will occur in the image part. Appropriate acidic comonomers include ethylene-type unsaturated monocarboxylic acids, such as acrylic acid, methacrylic acid, and crotonic acid, as well as ethylene-type unsaturated dicarboxylic acids, such as fumaric acid, itaconic acid, citraconic acid, vinyl succinic acid, and maleic acid, as well as their acid anhydrides and mixtures.

Since these acidic comonomers can combust in a low oxygen atmosphere, methacrylic polymers are more desirable than acrylic polymers.

When the non-acidic comonomer is an alkyl acrylate or alkyl methacrylate as described above, the content of the non-acidic comonomer is at least 50 wt %, preferably 70-75 wt %, of the total amount of the polymer binder. When the non-acidic comonomer is styrene or substituted styrene, it is preferred that the content of the non-acidic comonomer be 50 wt % of the total amount of the polymer, while the other 50 wt % is a half ester of an acid anhydride such as maleic anhydride. A preferable substituted styrene is α-methylstyrene.

Although it is not preferred, the non-acidic part of the polymer binder can also contain other non-acidic comonomers in an amount up to 50 wt % as substitutes of the alkyl acrylate, alkyl methacrylate, styrene, or substituted styrene part in the polymer. Examples include acrylonitrile, vinyl acetate, acrylamide, etc., as long as the criteria of the aforementioned composition and the following physical standard are satisfied. However, in order make these components more difficult to burn out, it is preferred to use the aforementioned monomers in an amount of less than about 25 wt % of the total amount of the polymer.

A single copolymer or a mixture of copolymers can be used as the binder as long as each of them satisfies the aforementioned standards. In addition to the aforementioned copolymers, other polymer binders can be added in a small amount. Examples include polymer olefins, such as polyethylene, polypropylene, polybutylene, polyisobutylene, and ethylene-propylene copolymer, as well as lower alkylene oxides, such as polyethylene oxide. The polymers can be manufactured by the specialists in the field of acrylate polymerization using the conventional solution polymerization technology. Typically, the acidic acrylate polymer can be manufactured as follows: an α- or ρ-ethylene type of unsaturated acid (acidic comonomer) is mixed with one or several types of copolymerizable vinyl monomers (non-acidic comonomer) in an organic solvent with a relatively low boiling point (75-150° C.) to obtain a solution containing 10-60% of the monomer mixture. The monomers are then polymerized by adding a polymerization catalyst, and the obtained mixture is heated to the reflux temperature of the solution under normal pressure. After the polymerization reaction is virtually completed, the generated acidic polymer solution is cooled to room temperature, followed by an evaluation to measure the viscosity, molecular weight, and acid equivalent of the polymer.

Also, it is necessary to keep the molecular weight of the acid-containing binder polymer at less than 50,000, preferably less than 25,000, and more preferably less than 15,000.

If the composition is applied by means of screen printing, the Tg (glass transition temperature) of the binder polymer is preferably 100° C. or higher.

After screen printing, the paste is usually dried at a temperature up to 100° C. If the Tg of the binder polymer is too low, the composition usually becomes very sticky. A low Tg value can be adopted for the substances that are applied using a method other than screen printing.

The content of the organic polymer binder is usually in the range of 5-45 wt % with respect to the total weight of the dried photopolymerizable layer.

(d) Photoinitiator

Certain photo initiators, even though thermally inactive, can generate free radicals at a temperature of 185° C. or lower under exposure to actinic rays. Examples include substituted or non-substituted polynuclear quinones, compounds having two inner molecular rings in a conjugated carbon ring system, such as 9,10-anthraquinone, 2-methylanthraquinone, 2-ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethylanthraquinone, 2,3-dimethylanthraquinone, 2-phenylanthraquinone, 2,3-diphenylanthraquinone, retene quinone, 7,8,9,10-tetrahydronaphthacene-5,12-dione, and 1,2,3,4-tetrahydrobenz(a)anthracene-7,12-dione. U.S. Pat. No. 2,760,863 disclosed some other useful optical initiators that are thermally active even at a temperature as low as 85° C. They are vicinal (vicinal) ketal donyl [sic] alcohols such as benzoin, and pivaloin, acyloin ethers such as benzoin methyl and ethyl ether, as well as α-hydrocarbon-substituted aromatic acyloins such as α-methylbenzoin, α-allylbenzoin, and α-phenylbenzoin.

The photoreductive dyes and reducing agents disclosed in U.S. Pat. Nos. 2,850,445, 2,875,047, 3,097,096, 3,074,974, 3,097,097, 3,145,104, 3,427,161, 3,479,186, and 3,549,367, such as phenatine, oxatine, and Michler's ketone (Michler's ketone) of the quinone class, benzophenone, and 2,4,5-triphenylimidazole dimer having hydrogen suppliers can be used as the initiators. Also, the sensitizer disclosed in U.S. Pat. No. 4,162,162 can be used together with the optical initiator and photopolymerization inhibitor. The content of the optical initiator is in the range of 0.05-10 wt % with respect to the total weight of the dried photopolymerizable layer.

(e) Photohardenable monomer

The photocurable monomer component used in the present invention is formed with at least one addition polymerizable ethylene type of unsaturated compound having at least one polymerizable ethylene group.

This compound is made from free radicals, then grown into chains, which are subjected to addition polymerization to form a polymer. The monomer compound is non-gaseous. In other words, it has a boiling point of 100° C. or higher and can be plasticized on an organic polymerizable binder.

Examples of appropriate monomers that can be used either alone or in combination with other monomers include t-butyl acrylate and methacrylate, 1,5-pentanediol diacrylate and dimethacrylate, N,N-dimethylaminoethyl acrylate and methacrylate, ethylene glycol diacrylate and dimethacrylate, 1,4-butanediol acrylate and methacrylate, diethylene glycol, diacrylate and dimethacrylate, hexamethylene glycol diacrylate and methacrylate, 1,3-propanediol diacrylate and dimethacrylate, decamethylene glycol diacrylate and methacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate, and methaacrylate, polyoxyethylated trimethylolpropane triacrylate and trimethacrylate, and the same compounds disclosed in U.S. Pat. No. 3,380,381, 2,2-di(p-hydroxyphenyl)-propane diacrylate, pentaerythritol tetraacrylate and tetramethacrylate, 2,2-di-(p-hydroxyphenyl)-propanediacrylate, pentaerythritol tetraacrylate and tetramethacrylate, 2,2-di(p-hydroxyphenyl)-propanedimethaacrylate, triethylene glycol diacrylate, polyoxyethyl-1,2-di-(p-hydroxyphenyl)propane dimethacrylate, di-(3-methacryloxy-2-hydroxypropyl)ether of bisphenol-A, di-(3-acryloxy-2-hydroxypropyl)ether of bisphenol A, di(2-methaklyoxyethyl)ether of bisphenol-A, di(2-acryloxyethyl)ether of bisphenol-A, di-(3-methalkyloxy-2-hydroxypropyl)ether of 1,4-butanediol, triethylene glycol dimethacrylate, polyoxypropyl trimethylol propanetriacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenylethylene-1,2-dimethacrylate, diallyl fumarate, styrene, 1,4-benzenediol dimethacrylate, 1,4-diisopropenylbenzene, and 1,3,5-triisopropenylbenzene.

It is also possible to use ethylene-type unsaturated compounds having a molecular weight of at least 300, such as the alkylene or polyalkylene glycol diacrylate manufactured from a C2-15 alkylene glycol or polyalklyene glycol having 1-10 ether bonds as well as the compounds disclosed in U.S. Pat. No. 2,927,022, especially those compounds having multiple addition polymerizable ethylene bonds when they are present as the terminal bonds.

Preferable examples of the monomers include polyoxyethylated trimethylolpropane triacrylate and trimethacrylate, ethylated pentaerythritol triacrylate, trimethylol propane triacrylate and trimethacrylate, dipentaerythritol monohydroxy pentaacrylate, and 1,10-decanediol dimethyl acrylate.

Other preferable monomers include monohydroxypolycaprolactone monoacrylate, polyethylene glycol diacrylate (molecular weight: about 200), and polyethylene glycol 400 dimethacrylate (molecular weight: about 400). The content of the unsaturated monomer component is in the range of 2-20 wt % of the total weight of the dried photopolymerizable layer.

(f) Organic Solvent

The main purpose of the organic medium containing organic solvents is to act as a vehicle for the dispersion of the fine solid in the composition so that it can be easily applied to ceramics or other base materials. Consequently, first of all, the organic solvent must be able to disperse the solid at a high stability. Second of all, the rheologic property of the organic solvent must be such that it can provide the dispersion with a good applicability.

When the dispersion is to be formed into a film, the organic medium with the ceramic solid inorganic binder powder dispersed in it can include other soluble substances, such as plasticizers, mold releasing agents, dispersants, peeling agents, antifouling agents, and wetting agents, depending on the polymer binder, monomers, and initiator dissolved in the organic solvent with the burnout property.

In addition, the solvent component in the organic medium may be a mixture of solvents, which should be selected appropriately so that a solution with a fully dissolved polymer and other organic components can be obtained, and so that the burnout property is high enough such that the solvent can be evaporated from the dispersion when a relatively low level of heat is applied under atmospheric pressure. In addition, the solvent must fully boil below the boiling points and decomposition temperatures of any other additives contained in the organic medium. Consequently, the solvents with a normal-pressure boiling point below 150° C. are used most frequently. Examples of such solvents include benzene, acetone, xylene, methanol, ethanol, Texanol, methyl ethyl ketone, 1,1,1-trichloroethane, tetrachloroethylene, amyl acetate, 2,2,4-triethylpentanediol-1,3-mono-isobutyrate, toluene, methylene chloride, and ethylene glycol monoalkyl, and dialkyl ether, such as ethylene glycol mono-n-propyl ether. To form a film, Texanol is especially preferred because of its burnout property.

In most cases, the organic medium may also contain one or several types of plasticizers, which are used to lower the Tg of the binder polymer. The plasticizer is also used to guarantee good lamination to the ceramic base and to increase the possibility of development of the unexposed part of the composition. However, the amount of the plasticizer added should be kept to the lowest level in order to reduce the amount of organic substances that must be eliminated when sintering the formed film. Of course, selection of the plasticizer is mainly determined by the polymer to be modified. Examples of the plasticizers that can be used in various types of binder systems include diethyl phthalate, dibutyl phthalate, butyl benzyl phthalate, dibenzyl phthalate, alkyl phosphate, polyalkylene glycol, glycerol, poly(ethylene oxide), hydroxyethylated alkylphenols, tricresyl phosphate, triethylene glycol diacetate, and polyester plasticizers. Since dibutyl phthalate can be used effectively at a relatively low concentration, it is frequently used for the acryl polymer systems.

(g) Dispersant

It is preferred to add a dispersant to guarantee that the inorganic binder powder is effectively wetted by the organic polymers and monomers. A completely dispersed inorganic binder powder is desired for preparing a photoactive paste that has good characteristics required for screen printing as well as a good homogeneity and burnout characteristic. The dispersant allows the polymer binder to bind the inorganic solid to generate a system free of coagulation. The dispersant that can be used is the A-B dispersant described in "Use of A-B Block Polymers as Dispersants for Non-aqueous Coating Systems" in the Journal of Coating Technology, vol. 58, No. 736, pp. 71-82, by Jakubauskas. The A-B dispersants that can be used are disclosed in U.S. Pat. No. 3,684,771, 3,788,996, 4,070,388, and 4,032,698 as well as UK Patent No. 1339930. A preferable A-B dispersant is the polymer represented by the following structural formula disclosed in U.S. Pat. No. 4,032,698 [No formula provided].

In the formula,

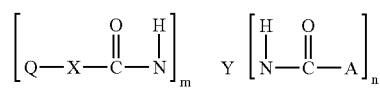

Q represents a polymer or copolymer segment of a-d listed below.

a. Alcohol or ester of acrylic acid and methacrylic acid having 1-18 carbon atoms;

b. Styrene or acrylonitrile;

c. Vinyl ester with the ester part having 2-18 carbon atoms; or d. Vinyl ether;

X represents the residue of the chain transfer agent; Y represents the residue of a di-, tri-, or tetraisocyanate radical after the isocyanate group is removed.

A represents the residue of the basic radical having a 5-14 pKa value or its salt as the substance before the reaction.

m and n are 1, 2, or 3, and the sum is not larger than 4. However, when n is 2 or 3, these numbers must be such that only one of A is defined.

Among this class, a preferable dispersant is referred to as A-B dispersant I hereinafter. It is a polymer with the following structure.

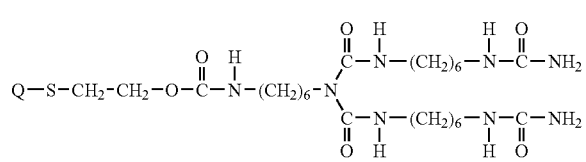

where, Q represents a segment of a methyl methacrylate polymer having a mean molecular weight of 6000-8000. A particularly preferable dispersant is one of the polymers represented by the following structural formulas.

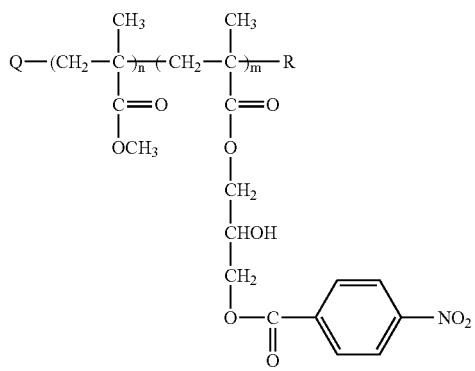

where, Q represents an alkyl methacrylate polymer segment having about 20 units of butyl methacrylate; n is 20, m is 8-12, and R represents the residue of the chain terminator.

The content of the dispersant is usually in the range of 0.1-5.0 wt % of the total amount of the photosensitive conductive composition.

(h) Stabilizer

It is preferred to add a stabilizer to the copper conductive composition. If no stabilizer is added, the copper will react with the acid functional groups in the polymer binder. As a result, the obtained composition will be crosslinked to become a hard block that is difficult to handle. Any compound, that can prevent the aforementioned crosslinking but has no adverse effect on other properties of the photosensitive conductive composition can be used before or after the sintering. Stabilization can also be achieved by forming a complex with the copper, by forming a salt with the acid functional groups, or by carrying out other reactions. Although the mechanism is not very clear, it is known that a triazole compound can act as a desirable stabilizer in the composition of the present invention. Benzotriazole is especially preferred.

The photopolymerizable composition is coated on a support film at a dried coating film thickness of about 0.0001 inch (0.0025 cm) to 0.01 inch (0.025 cm) or thicker. Preferably, one also uses an appropriate peeling support with a high dimension stability against temperature variation and selected from a wide range of films made of higher polymers, such as a polyamide, polyolefin, polyester, vinyl polymer, and cellulose ester. The thickness of the peeling support can be in the range of 0.0005 inch (0.0013 cm) to 0.008 inch (0.02 cm) or thicker. If exposure is performed before removing the peeling substrate, of course, the peeling support must be able to transmit a substantial part of the actinic ray radiation that is incident to the peeling support. If the peeling support is removed before exposure, the aforementioned restriction is not applicable. A particularly appropriate support is a transparent polyethylene terephthalate film with a thickness of about 0.0001 inch (0.0025 cm).

When the support film is stored in the form of a roll with no protective cover sheet, it is preferred to apply a thin parting layer of wax or silicone on the opposite side of the peeling support to prevent it from sticking to the photopolymerizable substance. In other cases, adhesion to the covered photopolymerizable layer can also be increased by performing a flame treatment or discharge treatment on the surface of the support to be covered.

The protective cover sheet, which can be removed during use, can also be selected from the films made of the same group of high polymers described above, and can also have a wide range of thickness. A cover sheet made of polyethylene and having a thickness of 0.0001 inch (0.0025 cm) is particularly suitable. The aforementioned support and cover sheet can well protect the photopolymerizable layer during storage before use.

On the other hand, when the dispersion is to be formed into a thick film paste, the ordinary organic solvents for thick film can be used together with appropriate rheology-adjusting agents and solvents with a low burnout property.

When the composition of the present invention is prepared as a composition for a thick film, it is usually applied onto the substrate by means of screen printing. In this case, the composition is usually formed as a smooth continuous layer rather than a pattern. Consequently, the composition must have an appropriate viscosity so that it can easily pass through the screen. Although the rheologic property is the most important, it is preferred to prepare the composition in such a way that the organic medium can provide the solid and the substrate with an appropriate wetness, good drying rate, dry film strength that is high enough to endure rough handling, and good sintering property.

It is also important for the sintered composition to have a satisfactory appearance.

If the conventional technology is used, the final composition will have a thixotropic property or, depending on the additives used in the composition, the Newtonian property [viscosity]. It is preferred that the composition have the Newtonian property.

The ratio of the organic medium to the inorganic solid in the dispersion varies over a wide range. It is determined by the method used to apply the dispersion and the type of organic medium used. Generally speaking, in order to attain desired conductive layers, the dispersion contains 50-90 wt % of a solid and 50-10 wt % of an organic medium. Such a dispersion usually has the consistency of a semi-fluid and is usually called a "paste". It is preferred to prepare the paste with a three-roll mill. Typically, the viscosity of the paste is in the range of 25-200 Pa.s. The amount and type of the organic medium used are mainly determined by the viscosity of the final desired component and the printing thickness.

As long as the photopolymerizable composition maintains its essential properties, the organic medium may also contain a small amount of other components, such as pigments, dyes, thermal polymerization inhibitors, adhesion promoters such as organosilane coupling agents, plasticizers and coating assistants such as polyethylene oxide. The organosilane is particularly useful when its amount is 3.0 wt % or less with respect to the amount of the inorganic particles. The treated particles further reduce the amount of the organic substances. Consequently, the amount of the organic substances in the coating film can be reduced. As a result, combustion becomes easier during sintering.

In the following, an example of the method using the aforementioned photosensitive copper conductive composition to form a gate electrode of a field emission type display device in a thick film pattern will be explained with reference to FIGS. 2 and 3.

Figure 2A:
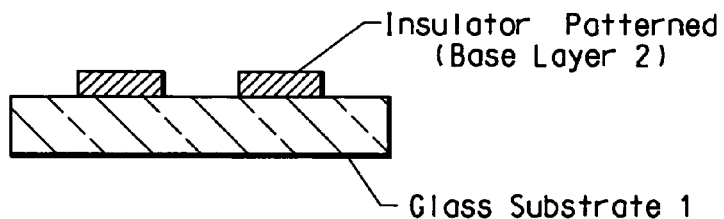
In FIG. 2(a) a glass-containing paste is coated on glass substrate (1) to form a base layer (2).
Figure 2B:
In FIG. 2(b) a conductive paste is coated on glass substrate (1) with base layer (2) formed on it.
Figure 2C:
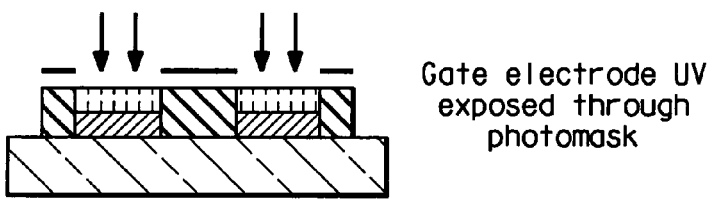
In FIG. 2(c), the conductive paste layer is then exposed to actinic rays in order to determine the exposed part. Exposure is performed via a photomask with a prescribed pattern design.
Figure 2D:
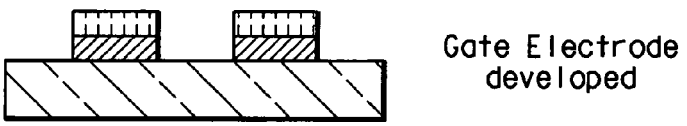
In FIG. 2(d), an alkaline aqueous solution is used to perform aqueous development (horizontal developing machine).
Figure 2E:
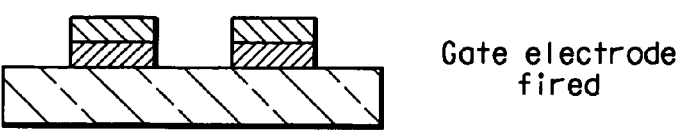
In FIG. 2e, the substrate is sintered.

First, as shown in FIG. 2a, a glass-containing paste is coated on glass substrate (1) to form a base layer (2). (FIGS. 2a-2e are diagrams explaining the gate-electrode forming process for easy understanding, but the present invention is not limited to them). As shown in FIG. 2b, the aforementioned copper conductive paste is coated by means of, for example, screen coating, to a dry film thickness of about 15-20 μm on glass substrate (1) with base layer (2) formed on it. After that, the coating is dried in a warm air circulating type of clean oven at about 80° C. for 20 min. As shown in FIG. 2c, the copper conductive paste layer is then exposed to actinic rays (UV rays are irradiated at an intensity of several hundred mJ/cm$^2$) in order to determine the exposed part. Exposure is performed via a photomask with a prescribed pattern design. In the present invention, as described in experiment 3, by using a photomask for testing the resolution with the exposure pattern becoming gradually thicker starting from a 5-μm-wide rectangular pattern (three in the longitudinal direction and three in the lateral direction), it is possible to test starting from the area in which in the exposure pattern be left without being removed by development (in μm). Then, as shown in FIG. 2d, an alkaline aqueous solution, such as a 0.4-wt % sodium carbonate solution is used to perform aqueous development (horizontal developing machine). The temperature is kept at about 30° C. The developer is sprayed through cone-shaped nozzles under a pressure of 2 kgf. The development time is the shortest development time (TTC: Time To Clear)×1.5 times. Rinsing is performed (with an apparatus attached to the developing machine) immediately after the alkaline solution development. The water on the substrate with the unexposed part of the electrode paste layer removed is eliminated by an air curtain. Then, the developed glass substrate (1) is then sintered in a muffle-type nitrogen belt sintering furnace in a controlled nitrogen atmosphere according to a sintering profile with the sintering temperature peak near 500° C. More specifically, in FIG. 2e, the substrate is sintered in a profile having about a 10 min period at a temperature of 500° C. or higher, a peak temperature of about 510° C., and a total of 108 min, with the oxygen concentration controlled at a total of four places, that is, two places where the temperature is lower than 300° C., one place where the temperature is in the range of 300-400° C., and one place where the temperature is 400° C. or higher. In particular, the sintered state of the photosensitive copper conductive composition is good with the oxygen concentration in the zone of 300-400° C. in the range of 100-500 ppm and with the oxygen concentration in the zone of 400° C. or higher in the range of 40-100 ppm. An appropriate range shows a resistivity of 100 μohm·cm or lower. However, according to Experiment 5 to be described later, the optimum oxygen concentration range also varies depending on the composition of the photosensitive copper conductive composition. For example, when the amount of the glass binder in the copper composition is increased, in order to obtain the lowest resistivity, the doping amount of the oxygen in the zone of 400° C. or higher must be increased. The resistivity is related to the sintered state of the copper. In order to accelerate sintering of the copper at a temperature as low as 500° C. to obtain a low resistivity, it is necessary to perform liquid-phase sintering with the glass binder used as the sintering assistant, well wet together with the copper powder. Oxide glass is usually used as the glass binder in consideration of the cost and availability. There is not much research on the oxynitride glass, etc. From the point of view of practical application, the authors considered a method for obtaining the desired resistivity (<100 μohm·cm) by accelerating the liquid-phase sintering of the copper powder using oxide glass at a low temperature. The authors have succeeded in obtaining the necessary adhesion strength to the base and the resistivity on practical levels by controlling not only the components of the copper composition, but also the amount of the doped oxygen, to fully burn out the organic component and sinter the copper powder. In the temperature range of 300-400° C., the organic component in the electrode paste can be burnt out. In the temperature range of 400-500° C., the inorganic binder powder and the copper powder can be sintered and, in the meantime, strongly adhered to the base.

The conventional sintering furnace, such as the muffle type of belt nitrogen sintering furnace produced by Koyo Thermosystem Co., Ltd., can be used. It is believed that the roller-hearth type of clean room large-scale sintering furnace used for PDP can be modified into the specifications of a nitrogen sintering furnace. A sintering furnace is comprised of a tunnel-shaped sintering chamber (zone) where substrates are sintered, a conveying belt or conveying apparatus that transports the substrates to pass through the sintering furnace, an air intake/exhaust apparatus used for circulating the air in the furnace, and multiple heaters that are arranged along the conveyance direction to heat the sintering furnace. In addition, the air intake/exhaust apparatus is equipped with a pipe used for supplying air controlled by an oxygen-concentration control device and an oxygen measurement device in order to supply the air with the oxygen concentration in the sintering furnace under control, an exhaust pipe for exhausting the air, a cooled-air supply pipe for supplying cooled air, and an exhaust pipe for exhausting the cooled air.

Figure 3:
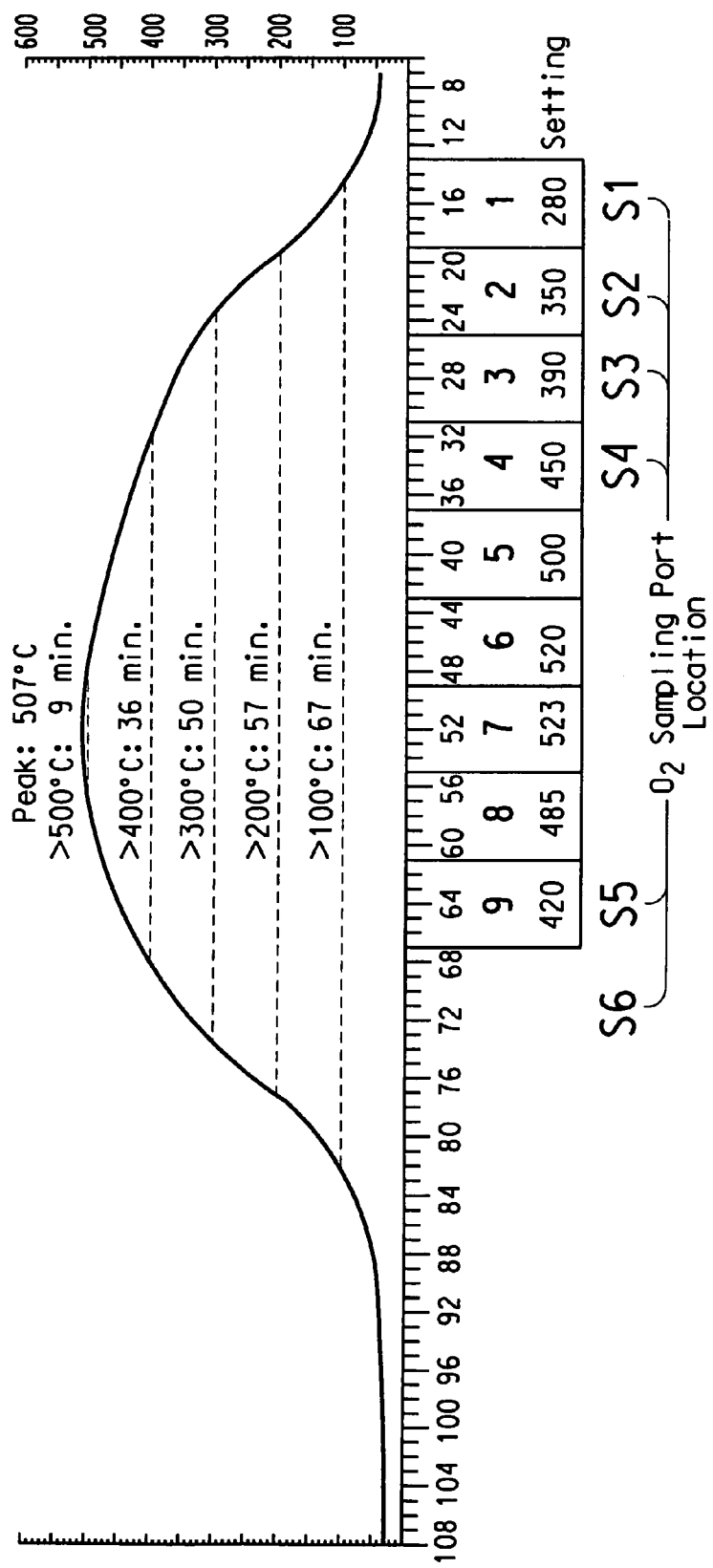
FIG. 3 shows an example of the sintering profile to illustrate the temperature change in the sintering furnace during sintering.

FIG. 3 shows an example of the sintering profile to illustrate the temperature change in the sintering furnace during sintering. In the present invention, when forming the electrode used for a field emission type display device, the oxygen concentrations in the burnout zone and sintering zone are adjusted.

EXAMPLES

In the following, application examples using the composition listed, below to experimentally form electrodes used for a field emission type display device according to the method described above will be explained. The present invention, however, is not limited to these application examples.

Experiment 1

For low-temperature sintering, an experiment was carried out to see whether copper and nickel powder would be sintered at 500-600° C. In Experiments 1-6 to be described, all of the organic binders used were photosensitive binders. The components and materials used in the application example are listed below.

a-1) Copper produced by Dowa Mineral Co., Ltd. KCL10, average particle size: 1.2 μm, specific surface area (BET): 1.08 m$^2$/g a-2) Nickel produced by Mitsui Mining & Smelting Co., Ltd.

Nickel powder A 2020SS average particle size: 0.44 μm, specific surface area (BET): 2.91 m$^2$/g Nickel powder B 2060SS average particle size: 0.7 μm specific surface area (BET): 1.76 m$^2$/g b) Glass frit A
  $SiO_2$—$BiO_2$—$B_2O_3$—$ZnO$ type of amorphous glass
    $BiO_2$ 71 wt %
    $ZnO$ 12
    $B_2O_3$ 8
    $SiO_2$ 7
    $Al_2O_3$ 2
  Softening point (DTA) 500° C.
  Average particle size: 1.2 μm Glass frit B
  $SiO_2$—$PbO$—$B_2O_3$ type of amorphous glass
    $PbO$ 77 wt %
    $B_2O_3$ 13

SiO$_2$ 9
Al$_2$O$_3$ 1
Softening point (DTA) 430° C.
Average particle size 1.4 μm
c) Polymer binder: Acrylic Resin (Carboset XPD1234)
10%
(wt % with respect to 100% paste; same hereafter)
d) photo initiator: Isopropyl Thioxanthone (Quantacure ITX)
4%
e) Photohardenable monomer: Ethoxylated Trimethylolpropane Triacrylate
7%
f) Organic solvent: Texanol
19%

The vehicle used was the mixture of said c) to f), which was dispersed and dissolved in an organic solvent at a temperature in the range of room temperature to 100° C. to obtain a low-viscosity vehicle. 60 wt % of the inorganic powder listed in the following table was added to 40 wt % of the obtained vehicle to a total weight of 100%. The mixture was kneaded in a 3-roll mill to obtain the experimental paste. By using a stainless steel 250-mesh printing screen, a snake-shaped pattern of 0.5 mm×100 mm was printed with a screen printer on a 1×1-inch square glass substrate. After the printed substrate was dried with warm air at 80° C. for 20 min, it was exposed under about 7 mW/cm$^2$·400 mg/cm$^2$ UV light to obtain the parts used for the sintering experiment.

Figure 4:
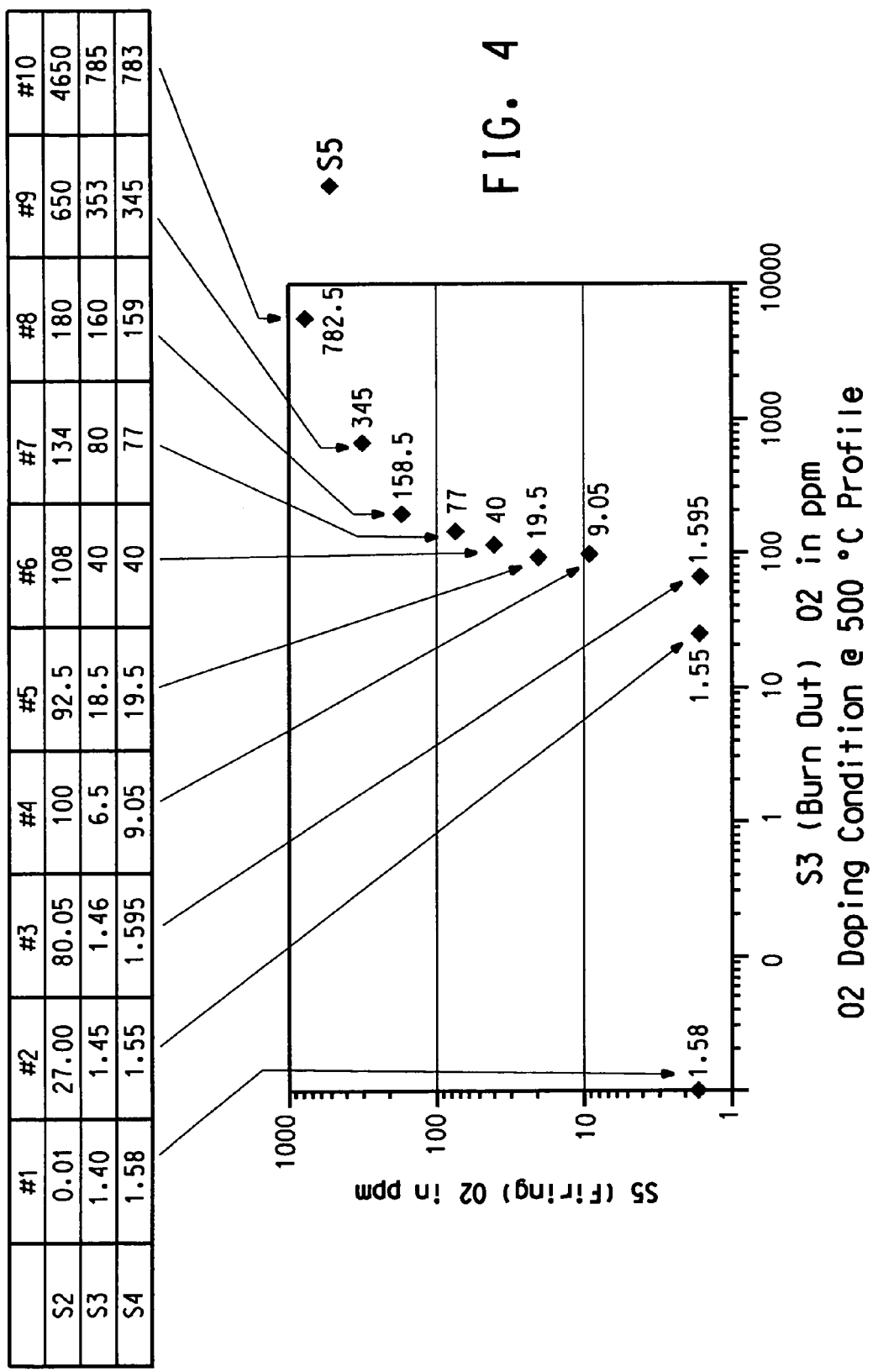
FIG. 4 shows a trapezoidal temperature profile of the sintering furnace.

The sintering furnace used was a muffle type 9-zone nitrogen belt sintering furnace 47-MT-61081-20AMC-36 produced by Koyo Thermosystem Co., Ltd. The trapezoidal temperature profile shown in FIG. 4 was formed. The amount of the doped oxygen was controlled via a mass flow controller at a total of four places, that is, three places for the burnout zone and one place for the sintering zone. The doping amount was obtained by measuring the oxygen concentration at a total of 6 places (S1-S6) through sampling ports using an oxygen concentration meter. It was found from the position relationship between the temperature profile and the sampling ports that S3 is the 300-400° C. zone with the temperature in the rising phase, S4 is the 400-500° C. zone with the temperature in a rising phase, and S5 is the 400-500° C. zone with the temperature in a dropping phase. Consequently, S3 was positioned as the O$_2$ sampling port of the burnout zone, while S4 and S5 were positioned as the O$_2$ sampling ports of the sintering zone. In Experiment 1, sintering, measurement of the resistance, and the tape peeling test were carried out at 500, 550, and 600° C. under the condition that no oxygen was doped (S3=S4=S5=0–2 ppm) and under the condition that a large amount of oxygen was doped (S3=180 ppm, S4·S5=160 ppm).

The resistance was measured by a multi-meter using the two ends of the serpentine pattern of 0.5 mm×100 mm as the hand probes. The resistance was converted into resistivity based on the thickness of the sintered film and the line width.

A tape peeling tester was appropriately positioned to test the adhesion strength to the base. Scotch tape (Mending tape MP-18 produced by Sumitomo 3M Co., Ltd.) was used. The tape was uniformly applied to cover half of the aforementioned snake-shaped pattern and six 2-mm square pads.

While one end of the tape was held with one hand, the tape was peeled off from the tested substrate in the direction perpendicular to the substrate. The peeled tape was stuck to a piece of color paper, and the peeling situation of the printed pattern was evaluated in 5 grades: That is, 1: all of the patterns are peeled off and stuck to the tape. There is no pattern left on the substrate. 2: Almost All of the patterns are peeled off and stuck to the tape. There is a small amount of pattern left on the substrate. 3: The peeled off patterns and the remaining patterns are mixed. 4: A few patterns are peeled off and stuck to the tape, while most of the patterns are left on the substrate. 5: No pattern is peeled off or stuck to the tape.

The results are shown in Table 1. For the Ni powder, the resistivity is 100 μohm·cm or higher irrespective of the presence/absence of the glass binder and the temperature, and the tape peeling mode is 1 in all of the cases. On the other hand, for the Cu powder sample, when the glass binder is added, the tape peeling mode is improved. For the sample containing glass B (Application Example 1), a resistivity below 100 μohm·cm is obtained under the condition of O$_2$ doping and 500-600° C. Among the Cu powder samples, only the resistivity of the inorganic composition of the Cu powder containing no glass binder cannot reach the target value, as can be seen from Comparative Example 1.

Experiment 2

Cu powder and Ni powder were used to prepare a total of 6 samples in the same procedure described in Experiment 1. Based on the results of Experiment 1, sintering was carried out at 500° C. under a total of 10 oxygen doping conditions, including the two conditions in Experiment 1. Measurement of the resistivity, tape peeling test, evaluation of the color of the sintered surface, and electron microscope observation were then performed. The oxygen doping conditions are shown in Table 2 and FIG. 4. The classification and results of the samples are shown in Table 3.

A sample containing Ni powder with an average particle size of 0.44 μm and glass binder that were also used in Experiment 1 was used in the comparative examples. A sample containing Cu powder with an average particle size of 1.1 μm and glass binder used in Experiment 1 was used in the application examples. Under the oxygen doping conditions #1 to #3 of Application Examples 3 and 4, the resistivity is high. On the other hand, a resistivity lower than 100 μohm·cm is displayed under conditions #4 to #9. Even if the type of the glass binder is changed, 100 μohm·cm is still obtained under conditions #4 to #5 (Application Example 1). Under conditions #7 to #10, the tap peeling mode is good. The mode is also improved for the Ni samples in the comparative examples.

For the samples of the application examples, when the sintered surface of the parts displaying a low resistivity is observed with the naked eye, a clear copper color can be observed. On the other hand, the parts displaying a high resistivity have a bright tawny color to burned tawny color. It is believed that the reason for this color is either that the copper is not sintered or the copper surface is oxidized. When all of the tested samples are observed under an electron microscope, the copper powder is barely sintered and remains in the original powdery state under conditions #1 to #3, and the glass powder is not melted. After condition #4, necking and particle growth are observed accompanied with melting of the glass powder and sintering of the copper powder. The sintering reaches the most significant level under conditions #7 to #9. Under condition #10, many bumps and dips occur on the copper surface where particles have grown. It is inferred that the copper surface is oxidized.

Experiment 3

Figure 5:
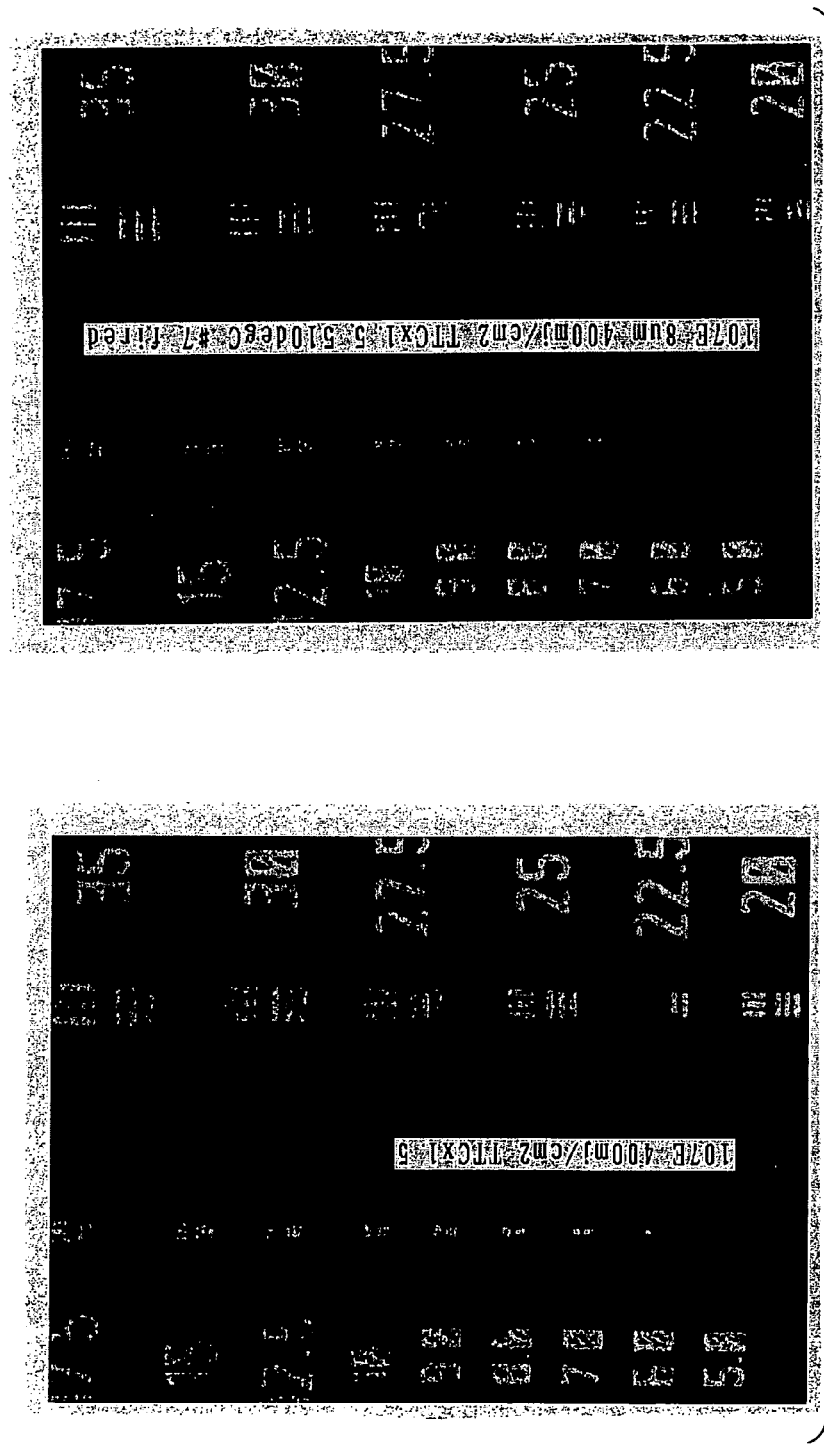
FIG. 5 shows the picture of sample parts exposed at 400 mJ/cm$^2$ before development and after sintering.

The patterning property under exposure and development of the sample of Application Example 4 used in Experiment 2 was tested. A 10×10 mm square solid pattern was printed on a 1-inch square glass substrate using a 250-mesh printing screen, followed by 80° C.×20 min warm air drying. The dry film thickness was about 8 μm. A chrome photomask made of glass and used for resolution confirmation was allowed to make soft contact with the substrate, which was exposed under irradiation of parallel UV light of an ultrahigh-pressure mercury lamp with an illuminance of 7 mW/cm$^2$ at an intensity of 100-800 mj/cm$^2$. The parts that were not covered by the chrome pattern were photopolymerized as a result of UV exposure to form a film that would not be affected by alkaline development. Development was then carried out as follows: 0.4% sodium carbonate ($Na_2CO_3$) aqueous solution (30° C., 2 kgf, head-vibrating type cone-shaped nozzles+rinsing+air curtain). First, the shortest development temperature (TTC: Time To Clear) of the unexposed part was measured. The TTC of the solid parts in Application Example 4 was about 11 sec. The tested parts were developed with the conveyance speed set appropriately so that the development time was TTC×1.5 (development time=16.5 sec). The water was then removed from the parts using the air curtain. One developed film was observed under each condition. Another film was sintered under the sintering condition #8 (see Table 2) in Experiment 2, and the sintered film was observed. As far as the exposure condition is concerned, although a pattern flow of thin lines (<30 μm) was present under the condition of 100 mJ/cm$^2$, a pattern of about 20 μm was formed under the condition of 200 mJ/cm$^2$ or higher. FIG. 5 shows the picture of the parts exposed at 400 mJ/cm$^2$ before development and after sintering. The thickness of the sintered film was about 5 μm. It was found that there is room for improvement of the sintering shrinkage and compactness. They can be improved by appropriately choosing the composition of the paste.

Experiment 4

Figure 6:
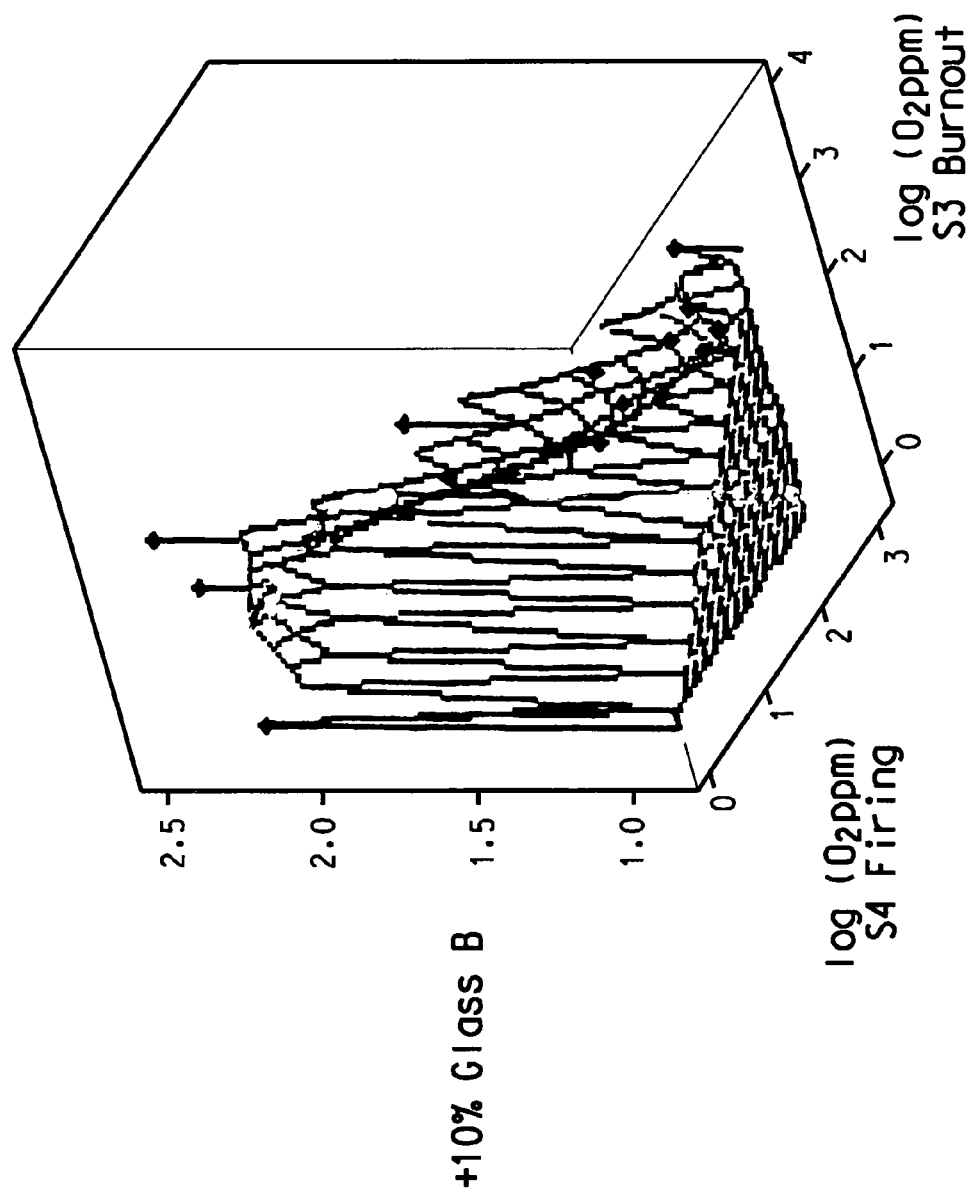
FIG. 6 shows a 3D wire plot of information detailed in Table 4, i.e., $O_2$ doping condition effect on resistivity.
Figure 7:
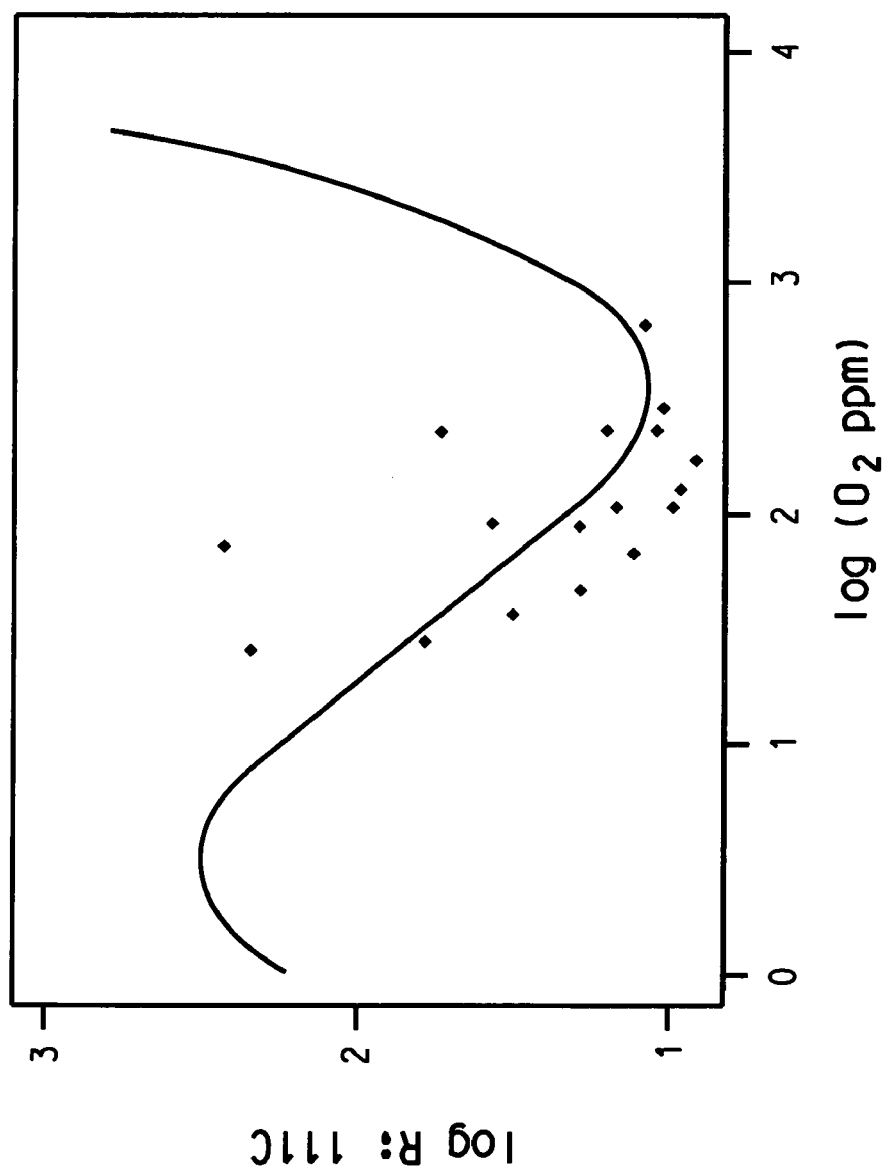
FIGS. 7-9 show the correlation of log (resistivity)—log ($O_2$ doping amount) by regression analysis.
Figure 8:
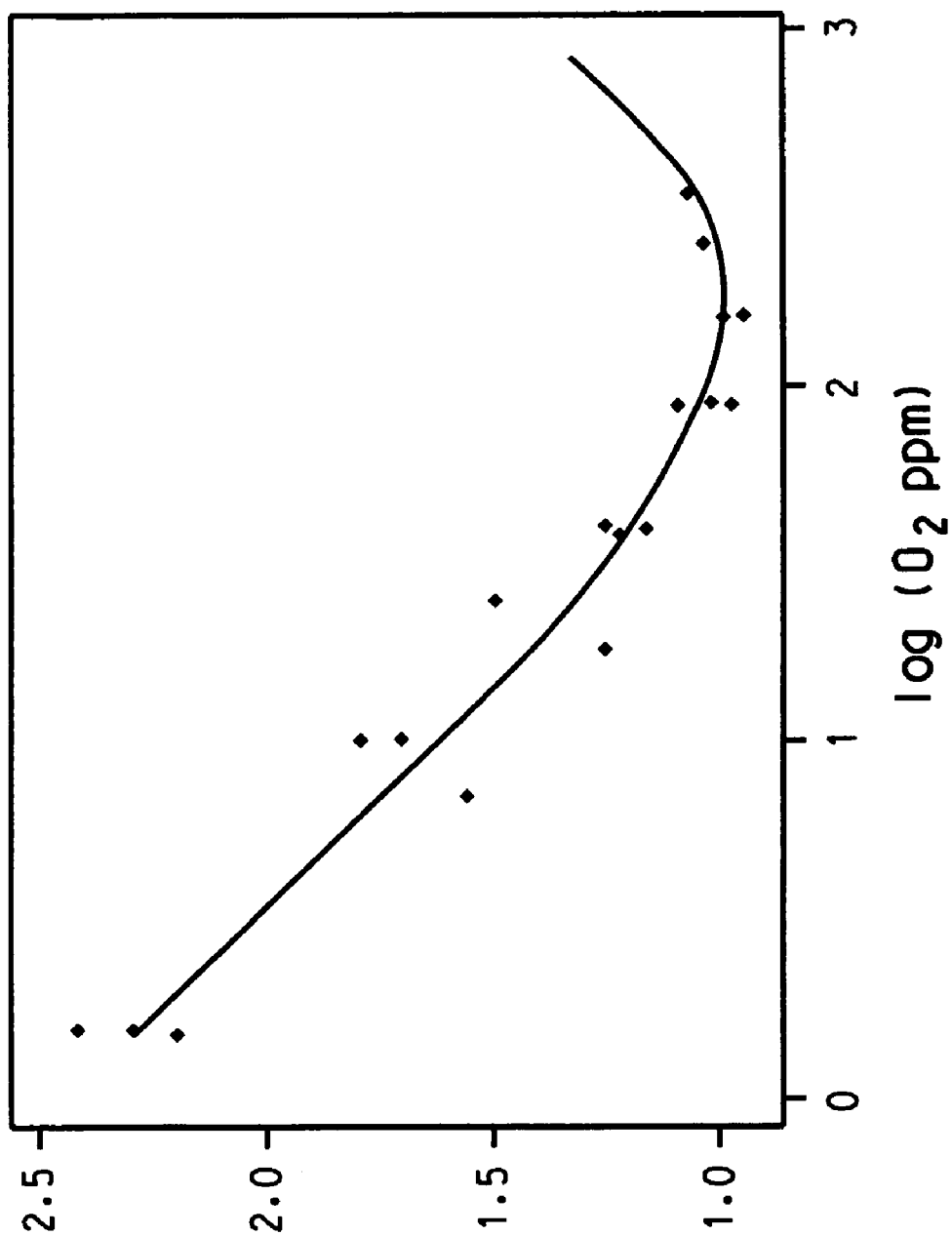
Figure 9:
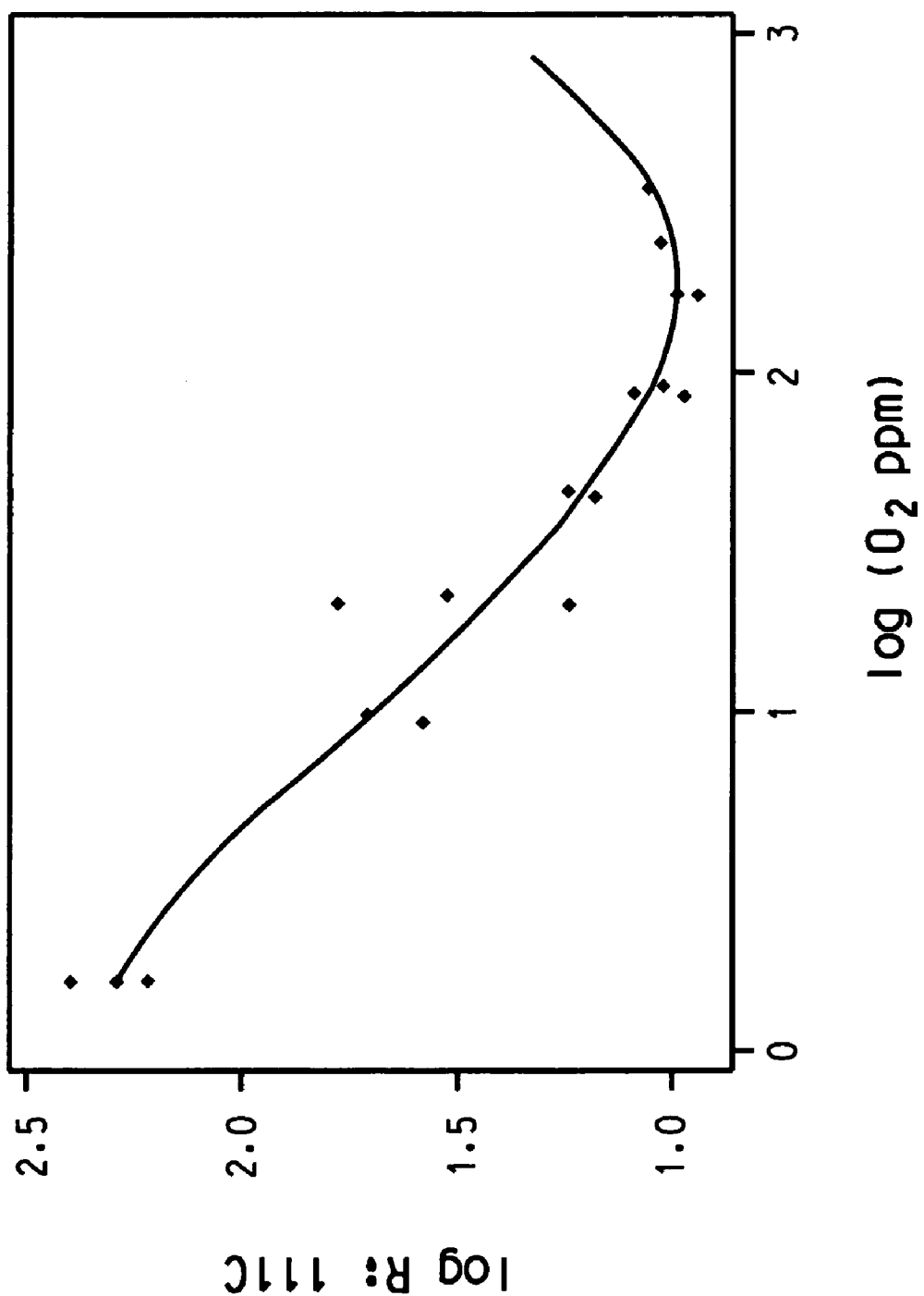

In order to further clarify the range of the oxygen concentration in the burnout zone and sintering zone for lowering the resistivity, a regression analysis was performed by adding conditions #11 to #19 to conditions #1 to #10 in Experiment 2. Table 4 shows the oxygen doping amounts in the burnout zone and sintering zone as well as the results of the resistivity in Application Example 4. Its 3D wire plot is shown in FIG. 6. As shown in the 3D wire plot, the resistivity (converted to log) shows a strong correlation with the oxygen doping amount in the sintering zone (S4). The correlation of log (resistivity)–log ($O_2$ doping amount) was studied by performing the regression analysis. The results are shown in FIGS. 7-9.

Log(resistivity)=2 is 100 μohm·cm. There is no correlation observed between the resistivity of Application Example 4 and the oxygen doping amount in S3 (burnout zone). The correlation with S4, S5 (sintering zones) is dominant. As the oxygen concentration in zones S4 and S5 is increased, the resistivity is decreased and reaches the minimum level at a certain concentration. After that, the resistivity starts to rise as the oxygen concentration is further increased. When the oxygen concentration exceeds several hundred ppm, the resistivity rises to such a high level that the resistance cannot be measured. Consequently, it is important to find out at which oxygen concentration the lowest resistivity will occur. On the other hand, there is no strong correlation between the oxygen concentration in the burnout zone and the resistivity. Instead, a certain oxygen concentration is required in the burnout zone in order to burn out the photosensitive organic component.

Experiment 5

Figure 10:
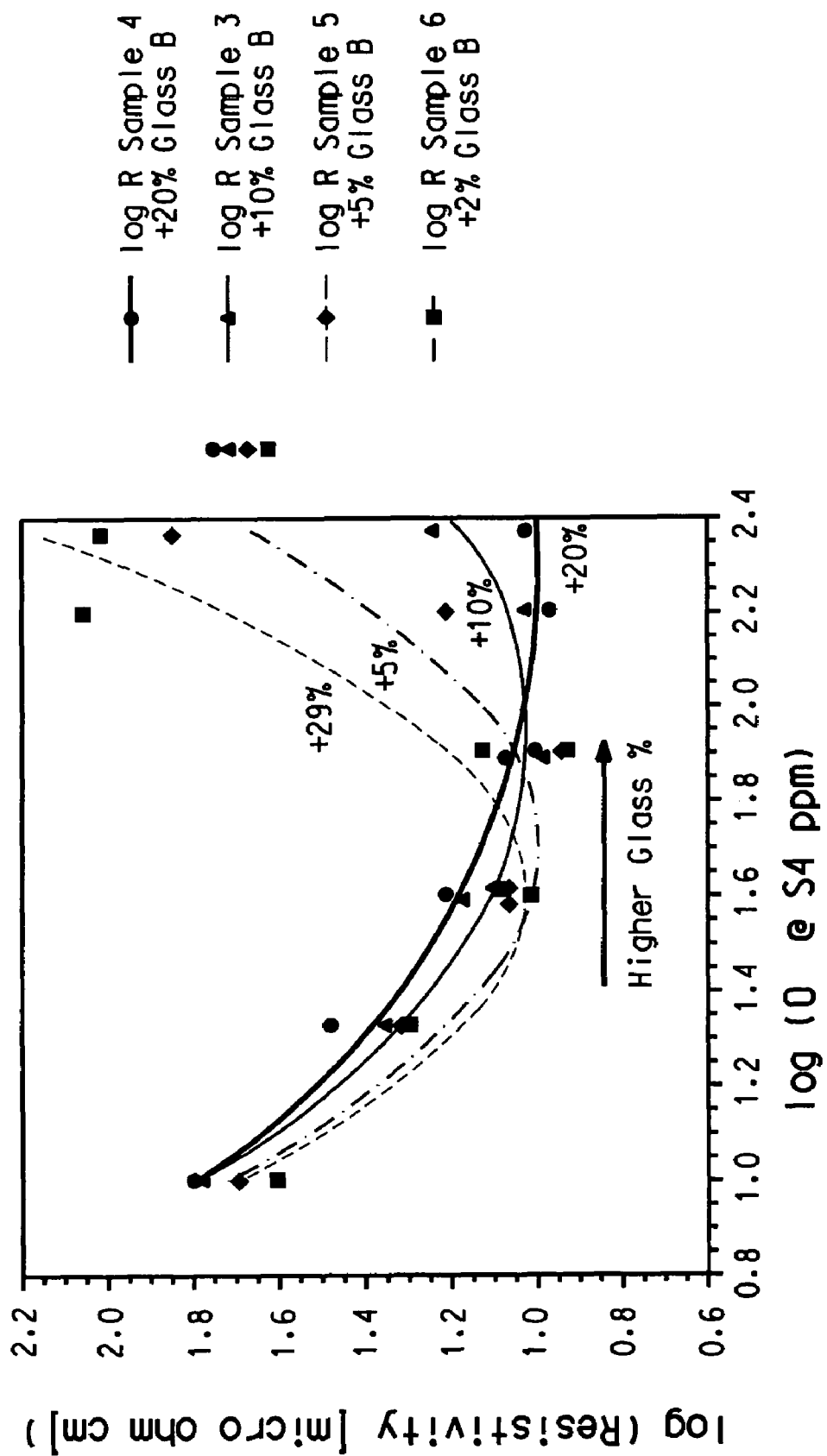
FIG. 10 shows a plot of log resistivity vs. the oxygen concentration (log) in S4 (sintering zone) for Application Examples 3-6.

An experiment was conducted to test the effect of the amount of glass B in the copper composition in order to confirm how the oxygen concentration, at which the resistivity of the sample sintered at 500° C. reached the lowest level, varied depending on the glass amount. A total of 4 samples, that is, Application Example 3 (+10% glass B), Application Example 4 (+20% glass B), and newly prepared Application Example 5 (+5% glass B) and Application Example 6 (+2% glass B) were sintered under oxygen doping conditions #11 to #19 (see Table 4). The plot of log resistivity vs. the oxygen concentration (log) in S4 (sintering zone) is shown in FIG. 10. As can be seen from the secondary regression curve, the oxygen concentration at which the resistivity reaches the lowest level shifts to the high concentration side as the glass amount is increased. It is believed that the composition can be appropriately chosen to intentionally shift the lowest point [of the resistivity] to the low concentration side or to the high concentration side.

Experiment 6

Figure 11:
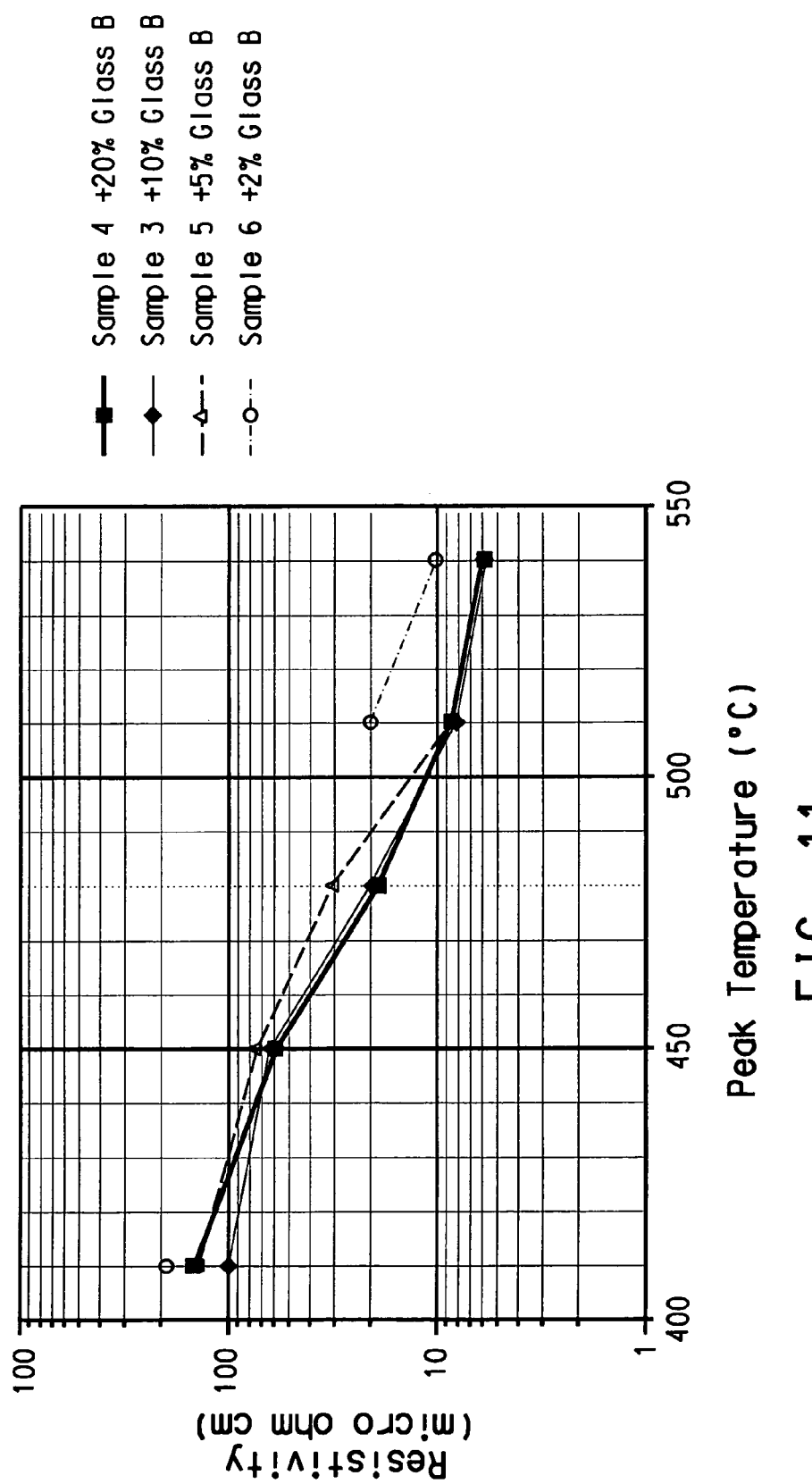
FIG. 11 shows the resistivity-sintering temperature relationship of Application Examples 3-6.

Application Examples 3-6 with different glass amounts were used to confirm the influence of the sintering temperature. The oxygen doping condition was fixed at #8 (S3=180 ppm, S4=S5=160 ppm). Table 5 lists the film thickness, resistivity, and tape peeling test results. The resistivity—sintering temperature relationship is shown in FIG. 11. Except for the +2% glass sample (Application Example 6), all other samples displayed a resistivity of 100 μohm·cm or lower at 450° C. or higher. The resistivity decreased as the sintering temperature was raised. For the +2% glass sample (Application Example 6), as described in Experiment 5, the measurement was impossible since the oxygen concentration in the sintering zone was much higher than the concentration where the lowest resistivity occurred. As far as the tape peeling mode is concerned, the samples were already difficult to peel off at 410° C. Almost all samples could not be peeled off at a temperature of 450° C. or higher. The results of observing the sintering state under an electron microscope showed that necking and particle growth of the copper powder had already started at 450° C. Based on these results, it is believed that the copper composition of the present patent can be sintered at 450° C. or higher by appropriately doping oxygen.

EFFECTS OF THE INVENTION

By using the photosensitive copper conductive composition disclosed in the present invention and the reductive atmosphere doped with oxygen in an appropriate amount and used for sintering the aforementioned composition, a low resistivity of 100 μohm·cm or lower can be obtained in a relatively easy way at a sintering temperature of 450-600° C.; also, a thick film conductor with an appropriate adhesion strength and high resolution can be formed. This method can be used to form electrodes for a field emission type display device.

What is claimed is:

1. A method for forming an electrode of a field emission type of display device, characterized by having the following steps:

a step in which a photosensitive copper conductive composition comprising: a mixture of (a) copper powder at least 70 wt % out of 100 wt % copper powders having a particle size in the range of 0.2-3 μm and (b) an inorganic binder with a softening point in the range of 380 to less than 500° C. in an amount of 1-40 wt % based on 100 wt % copper powders, said mixture being dispersed in an organic vehicle comprising (c) an organic polymer binder, (d) a phototoinitiator, (e) a photohardenable monomer, and an organic solvent; and the photosensitive copper conductive composition being fireable at a temperature in the range of 450-600° C. in a reductive atmosphere is coated as an electrode on an underlying layer of dielectric layer formed on a glass substrate, a step in which the coated layer is exposed to actinic radiation through a prescribed electrode pattern mask to photopolymerize the exposed part, a step in which the development is performed to remove the unexposed part, and a step in which sintering is performed based on a sintering profile with the sintering peak temperature around about 500° C. in a reductive atmosphere to burn out the organic solvent and to sinter the inorganic binder powder and the copper powder.

2. A method for constituting an electrode of a field emission type of display device, characterized by having the following steps:

a step in which the photosensitive copper conductive composition comprising: a mixture of (a) copper powder at least 70 wt % out of 100 wt % copper powders having a particle size in the range of 0.2-3 μm and (b) an inorganic binder with a softening point in the range of 380 to less than 500° C. in an amount of 1-40 wt % based on 100 wt % copper powders, said mixture being dispersed in an organic vehicle comprising (c) an organic polymer binder, (d) a phototoinitiator, (e) a photohardenable monomer, and an organic solvent; and the photosensitive copper conductive composition being fireable at a temperature in the range of 450-600° C. in a reductive atmosphere is coated as an electrode on an underlying layer of dielectric layer formed on a glass substrate, a step in which the coated layer is exposed to actinic radiation through a prescribed electrode pattern mask to photopolymerize the exposed part, a step in which the development is performed to remove the unexposed part, and a step in which sintering is performed based on a sintering profile with the sintering peak temperature around about 500° C. in a reductive atmosphere, in which the oxygen concentration at the temperature range of 300-400° C. for burning out the organic solvent in the aforementioned profile is in the range of 30-1000 ppm and the oxygen concentration at a temperature of 400° C. or higher for sintering the inorganic binder powder and the copper powder is in the range of 10-500 ppm.

\* \* \* \* \*